(12) United States Patent
Singh et al.

(10) Patent No.: US 7,704,835 B2
(45) Date of Patent: Apr. 27, 2010

(54) METHOD OF FORMING A SELECTIVE SPACER IN A SEMICONDUCTOR DEVICE

(75) Inventors: Rajwinder Singh, Beaverton, OR (US); Willy Rachmady, Beaverton, OR (US); Uday Shah, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 562 days.

(21) Appl. No.: 11/648,512

(22) Filed: Dec. 29, 2006

(65) Prior Publication Data

US 2008/0157131 A1 Jul. 3, 2008

(51) Int. Cl.
*H01L 21/336* (2006.01)

(52) U.S. Cl. .................. 438/267; 257/350

(58) Field of Classification Search .......... 257/350; 438/267
See application file for complete search history.

(56) References Cited

U.S. PATENT DOCUMENTS

2005/0260808 A1* 11/2005 Chen et al. ............... 438/197
2006/0006476 A1* 1/2006 Biery et al. ............... 257/382
2007/0114581 A1* 5/2007 Park ......................... 257/288
2008/0003755 A1* 1/2008 Shah et al. ................. 438/300

OTHER PUBLICATIONS

Uday Shah et al., "A Sacrificial Oxide Layer Which Enables Spacer Over-Etch in Tri-Gate Architectures", U.S. Appl. No. 11/479,713, filed Jun. 30, 2006, 23 pages.

* cited by examiner

*Primary Examiner*—Thao X Le
*Assistant Examiner*—Elias Ullah
(74) *Attorney, Agent, or Firm*—Blakely, Sokoloff, Taylor & Zafman LLP

(57) ABSTRACT

A selective spacer for semiconductor and MEMS devices and method of manufacturing the same. In an embodiment, a selective spacer is formed adjacent to a first non-planar body having a greater sidewall height than a second non-planar semiconductor body in a self-aligned manner requiring no patterned etch operations. In a particular embodiment, a margin layer of a particular thickness is utilized to augment an existing structure and provide sufficient margin to protect a sidewall with a spacer that is first anisotropically defined and then isotropically defined. In another embodiment, the selective spacer formation prevents etch damage by terminating the anisotropic etch before a semiconductor surface is exposed.

9 Claims, 9 Drawing Sheets

METHOD OF FORMING A SELECTIVE SPACER IN A SEMICONDUCTOR DEVICE

BACKGROUND OF THE INVENTION

1. Field of the Invention

The present invention relates to the field of manufacturing of semiconductor devices and micro electro-mechanical systems (MEMS), and more particularly to the formation of spacers.

2. Discussion of Related Art

For many years spacers have been employed in the manufacture of semiconductor and MEMS devices. Generally, a spacer is a material ultimately retained only on the sidewalls of non-planar structures. The formation of a spacer typically proceeds by depositing a film over a non-planar structure and anisotropically etching the film by an amount sufficient to at least the as-deposited thickness of the film. The anisotropic character of the etch process leaves a spacer only where deposition of the film on the sidewall of the non-planar structure increases the effective thickness of the film. Therefore, the thickness of the film deposited on the sidewall determines the final spacer thickness after the bulk of the film has been etched away.

One reason the conventional spacer process has found wide application in industry is because of its "self-aligned" nature. The formation of the spacer itself requires only a blanket deposition and an unpatterned anisotropic etch to consistently form a spacer of a controlled lateral thickness (i.e. width) adjacent to another feature from the sidewall of the non-planar structure. Unfortunately, as devices have become more advanced, the self-aligned nature of a spacer begins to have significant disadvantages. For example, more advanced devices have more severe topography and the need to prevent a spacer from forming on a particular sidewall of a device may be in conflict with the need to form a spacer on another sidewall of the same device.

Conventional multi-gate transistor 100 in FIG. 1A, serves to illustrate this point further. A non-planar semiconductor body 115, having sidewall 107 with sidewall height $H_1$, and top surface 108, is formed adjacent to isolation 110 over substrate 102. Top surface 108 and sidewall 107 are apportioned into a non-planar source/drain regions 116 and a channel region. The channel region is that portion of non-planar semiconductor body 115 covered by a gate stack with a sidewall height $H_2$ and comprised of gate insulator 112 and gate electrode 113. In this transistor design, the device can be gated by the gate stack through sidewall 107 as well as the top surface 108 of the device. Because the channel is gated by multiple gate electrode-semiconductor interfaces, the transistor having a non-planar channel is frequently called a multi-gate device.

As further shown in FIG. 1A, spacer 119 is formed to offset or "space" non-planar source/drain regions 116 from the channel region covered by the gate stack. The self-aligned nature of the conventional spacer formation process dictates that spacer 118 is formed adjacent to sidewall 107 by the same process that forms spacer 119. While spacer 119 is desirable, spacer 118 may be undesirable because, for example, spacer 118 limits access to non-planar semiconductor body 115 in non-planar source/drain regions 116. Thus, undesirable spacer 118 leaves only the area of the top surface of non-planar source/drain regions 116 having length L and width W accessible to subsequent processing. Therefore, the non-selective nature of the conventional spacer shown in FIG. 1A can be problematic.

FIG. 1B represents a cross-sectional view of the multi-gate transistor of FIG. 1A taken along the A-A' reference line. Here again, spacer 118, undesired, is adjacent to non-planar semiconductor body 115 extending over isolation 110 on substrate 102. Spacer 119, desired, is adjacent to gate stack 114. Also visible in FIG. 1B is etch damage to semiconductor surface 125 spanning the length L of the top surface of non-planar source/drain regions 116. Damage to semiconductor surface 125 is a result of exposing semiconductor surface 125 to a plasma-based anisotropic etch during a conventional spacer formation process.

DETAILED DESCRIPTION OF THE PRESENT INVENTION

In various embodiments, semiconductor devices with selective spacers are described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Embodiments of the present invention include a device having a first and second sidewall and a selective spacer. A selective spacer is a spacer that, without requiring a patterned etch, is formed on the second sidewall, but not on the first sidewall.

Figure 1A:
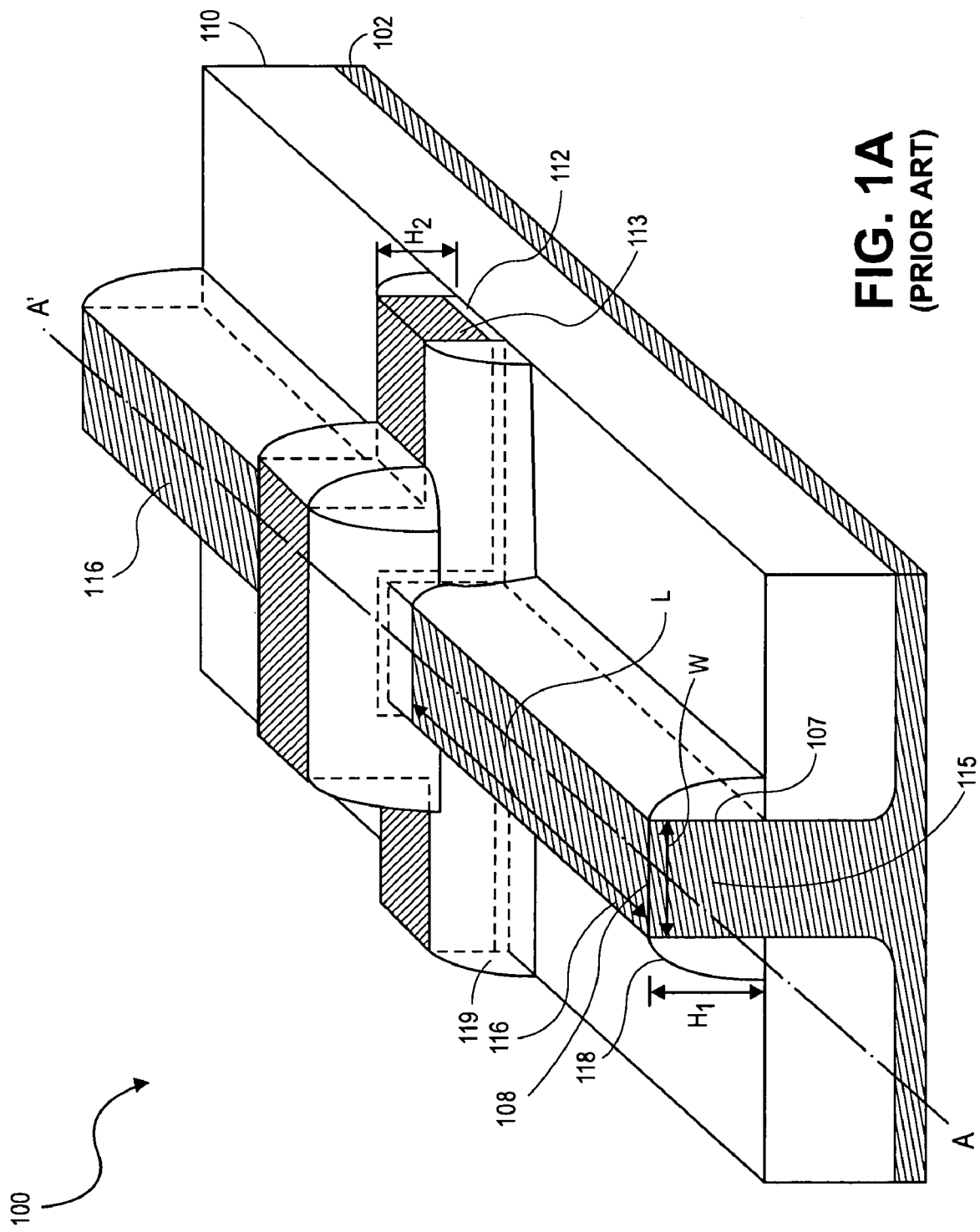
FIG. 1A is an illustration of a perspective view of a semiconductor device with conventional spacers.
Figure 1B:
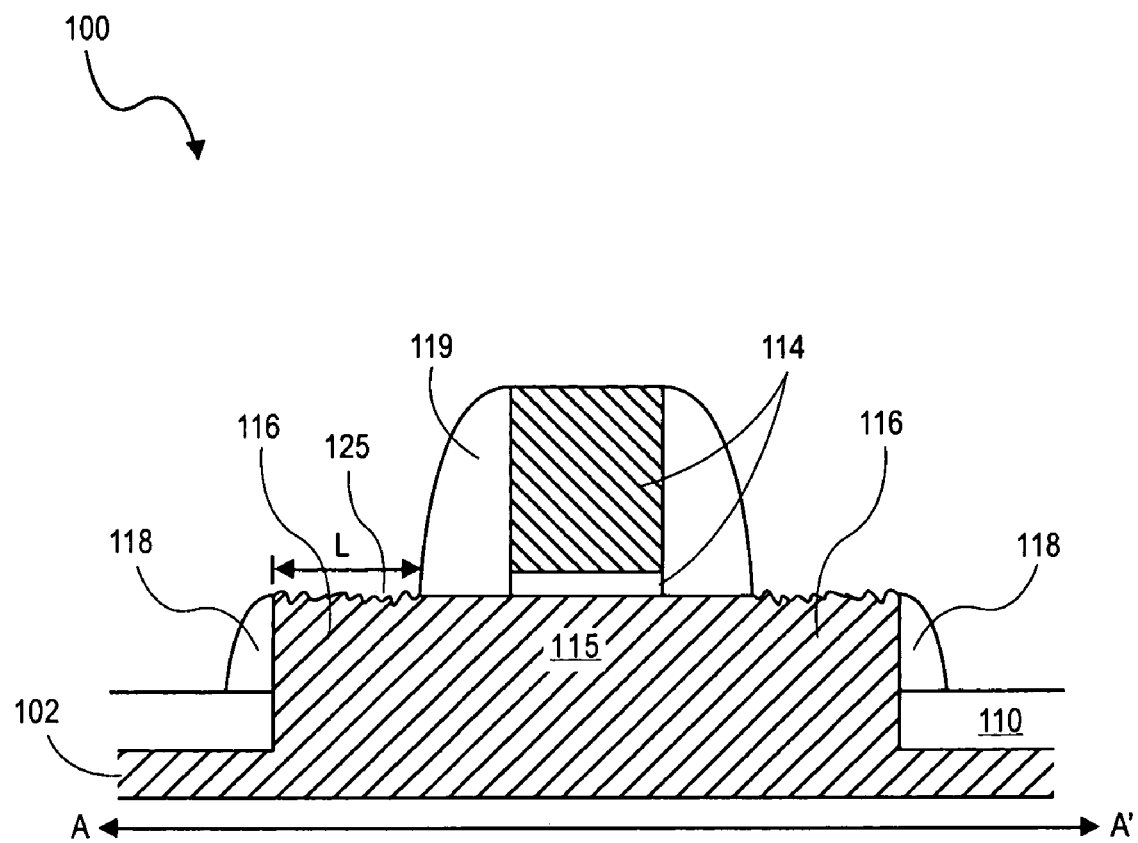
FIG. 1B is a cross-sectional view of a semiconductor device with conventional spacers.
Figure 2:
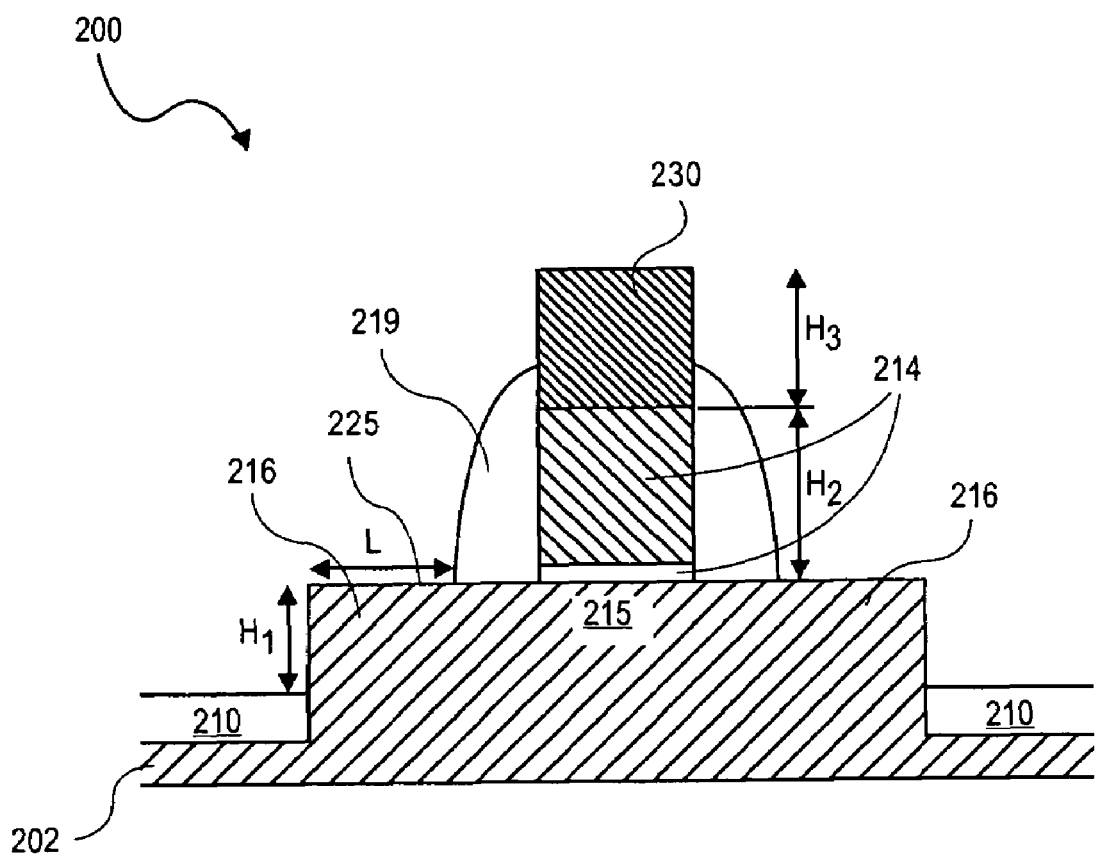
FIG. 2 is a cross-sectional view of a semiconductor device with spacers in accordance with an embodiment of the present invention.

In one embodiment, as shown in the cross-sectional view of FIG. 2, device 200 is multi-gate transistor on substrate 202 having non-planar semiconductor body 215 adjacent to isolation 210. As shown, selective spacer 219 is retained on the sidewall of non-planar gate stack 214 while the sidewall of non-planar semiconductor body 215 is substantially free of spacer. Selective spacer 219 is adjacent to (i.e. protecting) the entire gate stack 214 sidewall height $H_2$, while non-planar semiconductor body 215 sidewall height $H_1$ is free of spacer (i.e. exposed). It should be appreciated that device 200 has a similar structure to semiconductor device 100, of FIG. 1A, such that the sidewall height H1, free of spacer, extends along the distance L of non-planar semiconductor body 215 parallel to the cross-sectional plane of FIG. 2. Thus, the sidewalls of non-planar source/drain regions 216 are substantially free of spacer. One of skill in the art should also appreciate that selective spacer 219 defines a self-aligned offset, or space, between non-planar source/drain regions 216 and gate stack 214 without requiring lithography to separate non-planar source/drain regions 216 from gate stack 214 (i.e. source/drain regions 216 are self-aligned). Similarly, because sidewall height $H_1$ along the length L of non-planar source/drain regions 216 has no spacer, the sidewall free of spacer is also self-aligned to gate stack 214. Thus, in this embodiment, the selective spacer process enables device 200 to have non-planar source/drain regions 216 that are substantially free of spacer. This enables the semiconductor sidewall surfaces of non-planar source/drain regions 216 to be accessed during subsequent processing without requiring a lithographically patterned etch to selectively remove a portion of spacer material.

Because no lithography is required to form selective spacer 219 adjacent gate stack 214, the structure of FIG. 2 can have sublithographic dimensions. In one embodiment the width of selective spacer 219 is sublithographic. Sublithographic is a relative term meaning for any imaging technology used in the fabrication of device 200, the dimension of selective spacer 219 is smaller than can be imaged by that imaging technology. Because the width of selective spacer 219 is sublithographic, the distance between gate stack 214 and non-planar source/drain regions 216 that are substantially free of spacer is also sublithographic. Thus, in an embodiment, a first sidewall substantially free of spacer is a sublithographic distance from a second sidewall protected by selective spacer 219.

In a further embodiment, as shown in FIG. 2, gate stack 214 is augmented with margin layer 230. Generally margin layer 230 may be any material of sufficient thickness that the sum of sidewall height $H_3$ and the sidewall height $H_2$ is greater than the sidewall height $H_1$. In one such embodiment, the thickness of margin layer 230 is greater than the step height of non-planar semiconductor body 215 such that sidewall height $H_3$ is greater than sidewall height $H_1$.

In an embodiment, the device with selective spacer has semiconductor surfaces substantially free of spacer etch damage. As shown in FIG. 2, semiconductor surface 225 is substantially free of spacer etch damage along the length L after the formation of selective spacer 219.

Figure 3A:
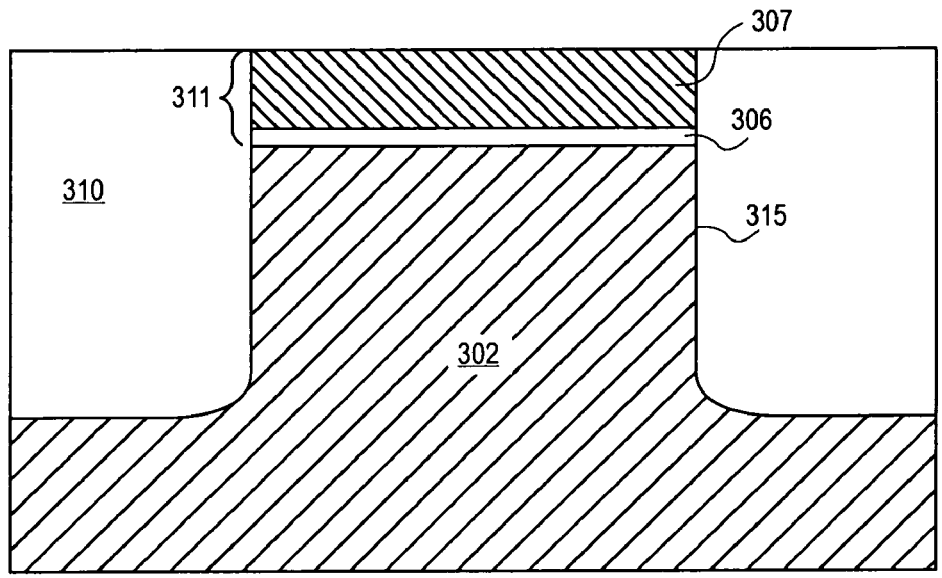
FIGS. 3A-3G are cross-sectional views of a semiconductor device at various stages of fabrication in accordance with an embodiment of the present invention.

A method of fabricating a selective spacer in a device in accordance with an embodiment of the present invention, as shown in FIG. 2, is illustrated in FIGS. 3A-3G. In a particular embodiment, as shown in FIG. 3A, fabrication begins with a "bulk semiconductor" substrate 302, such as, but not limited to, a monocrystalline silicon substrate or a gallium arsenide substrate. In a further embodiment, the substrate 302 is a bulk silicon semiconductor having a doped epitaxial silicon layer with either p-type or n-type conductivity at an impurity concentration level between $1\times10^{16}$-$1\times10^{19}$ atoms/cm$^3$. In another embodiment, substrate 302 is a bulk silicon semiconductor substrate having an undoped, or intrinsic epitaxial silicon layer. In a "bulk semiconductor" substrate, unlike a silicon-on-insulator (SOI) substrate, there is no "buried" insulating layer between semiconductor portion used to fabricate the active devices and the semiconductor portion used for handling. In alternate embodiments, commonly-known SOI substrates may be employed.

First, a mask is used to define the non-planar semiconductor bodies of the transistors. The mask can be any well-known material suitable for defining the semiconductor substrate. In one embodiment, the mask is itself a photo-definable material. In another embodiment, the mask is formed of a dielectric material that has been lithographically defined and etched. In a particular embodiment, as shown in FIG. 3A, mask 311 is a composite stack of materials, such as a nitride 307 on an oxide 306. If mask 311 is a dielectric material, commonly known techniques, such as chemical vapor deposition (CVD), low pressure chemical vapor deposition (LPCVD), plasma enhanced chemical vapor deposition (PECVD), or even spin on processes may be used to deposit the mask material while commonly known lithography and etching process may be used to define the mask. In an embodiment of the present invention, the minimum lithographic dimension is used to define the width of mask 311. In another embodiment, the minimum width of the mask 311 is sub-lithographic, formed by commonly known techniques such as dry develop or oxidation/strip.

As further shown in FIG. 3A, dielectric-filled trenches form isolation 310 on substrate 302. Using commonly known techniques, a portion of the semiconductor on bulk substrate 302 is etched to form recesses or trenches on substrate 302 in alignment with mask 311. The isolation etch defining the semiconductor body 315 has sufficient depth to isolate individual devices from one another and form a gate-coupled sidewall of adequate height to achieve the maximum desired channel width of the non-planar transistors.

Isolation 310 is completed by filling the isolation trenches and planarizing the substrate. In an embodiment of the present invention, isolation 310 include a liner of oxide or nitride on the bottom and sidewalls of the trenches formed by commonly known methods, such as thermal oxidation or nitridation. In an alternate embodiment, no liner is employed. Next, the trenches are filled by blanket depositing an oxide by, for example, a high-density plasma (HDP) chemical vapor deposition process. The deposition process will also form dielectric on the top surfaces of the mask 311. The fill dielectric layer can then be removed from the top of mask 311 by chemical, mechanical, or electrochemical, polishing techniques. The polishing is continued until the mask 311 is revealed, forming isolation 310, as shown in FIG. 3A. In a particular embodiment of the present invention, commonly known methods are used to selectively remove the mask 311. In another embodiment, at least a portion of mask 311 is retained.

If desired, wells can then be selectively formed for pMOS and nMOS transistors (not shown). Wells can be formed using any commonly known technique to dope the semiconductor between isolation 310 to a desired impurity concentration. In embodiments of the present invention, non-planar semiconductor bodies are selectively doped to p-type or n-type conductivity with a concentration level of about $1\times10^{16}$-$1\times10^{19}$ atoms/cm$^3$ using commonly known masking and ion implantation techniques. In a particular embodiment, the well regions extend into the semiconductor about 500 Å deeper than isolation 310.

Figure 3B:
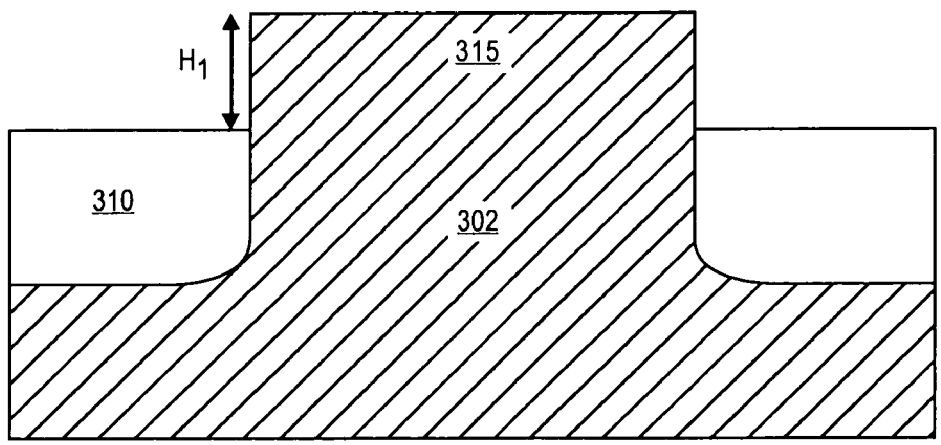

Next, a first non-planarity is introduced into the device. In a particular embodiment, as shown in FIG. 3B, isolation 310 is etched back to expose the sidewalls of the semiconductor without significantly etching the semiconductor, to form non-planar semiconductor body 315 having a sidewall height $H_1$. Any etch with good uniformity and etch rate control may be employed. In embodiments where semiconductor body 315 is silicon, isolation 310 can be recessed with an etchant comprising a fluorine ion, such as hydrofluoric acid (HF). In some embodiments, isolation 310 is recessed using a commonly known anisotropic etch, such as a plasma or RIE process using an etchant gas such as, but not limited to, hexafluoroethane ($C_2F_6$). In a further embodiment, an anisotropic etch can be followed by an isotropic etch, such as a commonly known dry process using a gas such as nitrogen trifluoride (NF$_3$), or a wet chemical etch such as HF, to completely remove isolation 310 from at least a portion of the semiconductor sidewalls.

A second non-planarity is then introduced in the device in a manner dependent on the type of device (dual-gate transistor, tri-gate transistor, opto-electronic device, MEMS, etc.). In the embodiment shown in FIG. 3C, gate stack 314 is formed on the top surface of the non-planar semiconductor body 315. In a tri-gate embodiment of the present invention, gate stack 314 is also formed adjacent to the exposed sidewalls in a direction out of the plane of FIG. 3C. In certain other embodiments, such as dual-gate transistors (not shown), the gate stack is not formed on the top surface of the non-planar semiconductor bodies. Gate stack 314 may be formed by commonly-known techniques, such as blanket depositing a gate electrode material over the substrate and then patterning the gate electrode material. In other embodiments of the present invention, the gate electrode is formed using "replacement gate" methods. In such embodiments, the gate electrode utilizes a fill and polish technique similar to those commonly employed in damascene metallization technology, whereby the recessed isolation may be completely filled with gate electrode material.

Gate stack 314 can include gate dielectric 312 and gate electrode 313. In an embodiment of the present invention, gate dielectric 312 is a silicon dioxide dielectric film grown with a dry/wet oxidation process. In an embodiment of the present invention, gate dielectric 312 is a deposited high dielectric constant (high-K) metal oxide dielectric, such as, but not limited to, tantalum pentaoxide, titanium oxide, hafnium oxide, zirconium oxide, aluminum oxide, or another high-K dielectric, such as barium strontium titanate (BST). A high-K film can be formed by well-known techniques, such as chemical vapor deposition (CVD) and atomic layer deposition (ALD). In further embodiments of the present invention, gate stack 314 further includes gate electrodes comprising metals such as, but not limited to, tungsten, tantalum nitride, titanium nitride or titanium silicide, nickel silicide, or cobalt silicide. In still other embodiments, the gate electrode comprises commonly known silicides.

Figure 3C:
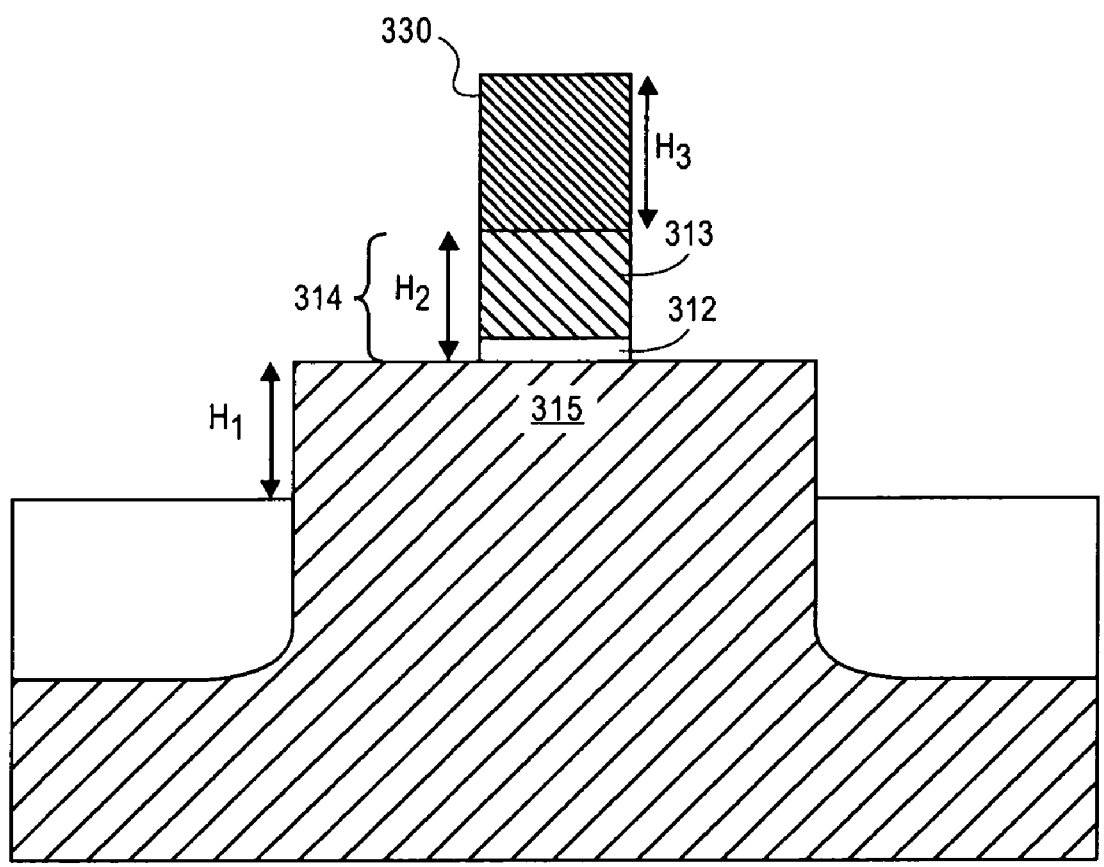

In an embodiment, as shown in FIG. 3C, the selective spacer process employs margin layer 330 over gate stack 314. As depicted, margin layer 330 is in alignment with gate stack 314 such that a sidewall of margin layer 330 is aligned with a sidewall of gate stack 314. In on embodiment, margin layer 330 is patterned by the same operation defining the gate stack. Margin layer 330 therefore augments the sidewall of gate stack 314, increasing sidewall height $H_2$ by an amount $H_3$ to form a combined sidewall height of $H_2+H_3$. In one embodiment, the thickness of margin layer 330 is selected to be sufficient for the total sidewall height $H_2+H_3$ to be greater than sidewall height $H_1$. Thus, the margin layer augments the second non-planarity in the device so that it is greater than the first non-planarity. In a further embodiment, the thickness of margin layer 330 is selected to be greater than sidewall height $H_1$. In another embodiment, the thickness of margin layer 330 is selected to be greater than sidewall height $H_1$ by an amount equal to an amount of under etch planned for the first unpatterned etch of the spacer film, discussed below, so that the total height of the second nonplanarity ($H_2+H_3$) is significantly greater than the height of the first non-planarity ($H_1$).

Depending on the device, margin layer 330 may be a dielectric, a semiconductor or a metallic material. Margin layer 330 may be the same or different material as the spacer film subsequently deposited. In one embodiment, margin layer 330 is a dielectric selected from the group comprising silicon oxides and silicon nitrides. In one such embodiment, margin layer 330 is a silicon oxy-nitride (SiON).

Figure 3D:
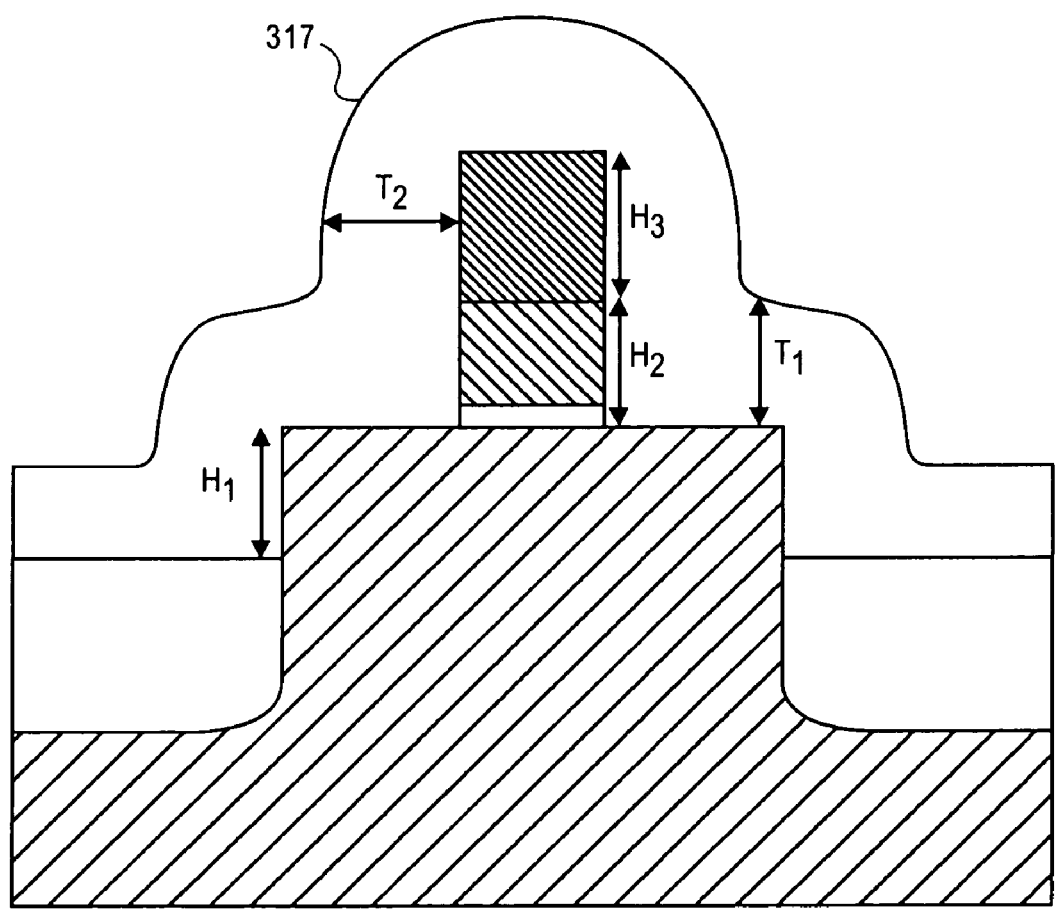

Next, a spacer film 317 is deposited over the device. Generally, as shown in FIG. 3D, spacer film 317 is blanket deposited to cover all structures. In one embodiment, spacer film 317 is conformal, such that thickness $T_1$ on a first surface is equal to thickness $T_2$ on a second surface orthogonal to the first. The thickness of the spacer film 317 defines the thickness of the selective spacer. In one embodiment, spacer film 317 is deposited to a thickness $T_1$ greater than the sidewall height $H_1$. In a further embodiment, spacer film 317 is deposited to a thickness less than the total sidewall height $H_3+H_2$. Therefore, in certain embodiments, a conformal spacer film 317 has a thickness $T_2$ that is less than the total sidewall height $H_3+H_2$.

Spacer film 317 may be any material commonly known to provide good step coverage. In an embodiment, spacer film is an oxide or nitride of silicon. Spacer film 317 may be a material distinct or the same as margin layer 330 to provide a desired selectivity (either higher or lower etch rate relative to spacer film 317) during a subsequent spacer etch. In an alternate embodiment, spacer film 317 may comprise a plurality of material layers. In one such embodiment, a first silicon nitride layer is deposited and second silicon oxide layer is deposited over the silicon nitride layer to form a composite or dual spacer. Deposition may be with any commonly known technique, such as, but not limited to, chemical vapor deposition (CVD), low pressure chemical vapor deposition (LPCVD), plasma enhanced chemical vapor deposition (PECVD), or high-density plasma (HDP) processes flowing precursors selected from the group consisting of silane (SiH$_4$), ammonia (NH$_3$), nitrogen (N$_2$), nitrous oxide (N$_2$O), oxygen (O$_2$), and water vapor (H$_2$O).

Figure 3E:
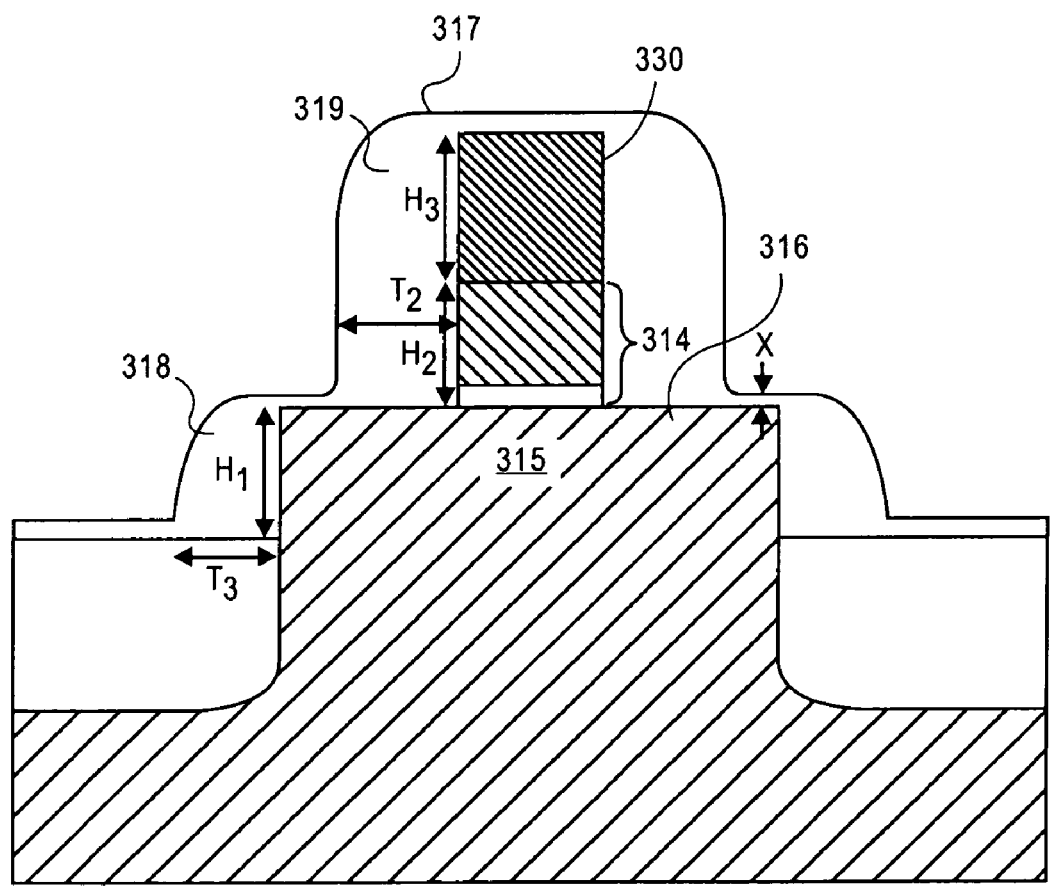

Then, a portion of the spacer film is removed with a first unpatterned etch to form an unselective spacer, as shown in FIG. 3E. Generally, the first unpatterned etch is any process capable of anisotropically etching spacer film 317. Any anisotropic etch with good uniformity, selectivity and etch rate control may be employed. In some embodiments, spacer film 317 is etched using a commonly known anisotropic etch, such as a plasma or reactive ion etch (RIE) process using an etchant gas such as, but not limited to, hexafluorethane (C$_2$F$_6$). If the first unpatterned etch is completely anisotropic, the thickness $T_2$ after etch will remain the thickness as deposited ($T_2$ in FIG. 3D). Because of the anisotropic character of the etch, the remaining thickness X on a first surface is significantly less the thickness $T_2$ on a second surface orthogonal to the first. Thus, the first unpatterned etch forms undesired spacer 318 adjacent to the sidewall of non-planar semiconductor body 315 as well as desired spacer 319 adjacent to the sidewall of gate stack 314 and margin layer 330.

In an embodiment, as shown in FIG. 3E, the thickness $T_3$ of undesired spacer 318 is less than thickness $T_2$ of desired spacer 319. This is a result of spacer film 317 being deposited to a thickness greater than the sidewall height $H_1$. However, because of the height differential between $H_1$ and $H_2+H_3$, the entire sidewall height $H_2$ is protected by desired spacer 319 having the thickness $T_2$, which is greater than thickness $T_3$ of undesired spacer 318. As discussed below, this difference in thickness helps to form a selective spacer.

In another embodiment, as shown in FIG. 3E, the first unpatterned etch anisotropically etches slightly less than the full deposited thickness of spacer film 317 (i.e. an under etch). Given an anisotropic etch rate of $R_d$, the anisotropic etch is performed for a time $(T_1-X)/R_d$. Because the anisotropic etch is terminated prior to etching through spacer film 317, remaining thickness X protects the underlying material from a harsh etching environment to greatly reduce etch damage. In the particular embodiment shown, non-planar source/drain region 316 is protected from anisotropic spacer etch damage thereby improving the quality of contacts later formed in or on non-planar source/drain region 316. In one such embodiment, a dual-layer spacer is utilized to allow an endpointed etch which terminates upon reaching the base layer of the composite spacer. For example, a silicon dioxide ($SiO_2$) layer is anisotropically etched and endpointed on a silicon nitride ($Si_3N_4$) layer of spacer film 317 to prevent damage to non-planar source/drain region 316. In this embodiment, as previously discussed, margin layer 330 is selected to have a thickness greater than sidewall height $H_1$ plus under etch thickness X.

Next, a second unpatterned etch is performed to remove an additional portion of the spacer film to form the selective spacer. Generally, the second unpatterned etch is isotropic. The isotropic etch employed depends on the composition of spacer film 317. In an embodiment, the isotropic etch employs an oxidizing wet chemistry. In a specific embodiment, where spacer film 317 is a nitride or oxide of silicon, the isotropic etch employs a wet chemical solution comprising phosphoric acid ($H_3PO_4$) or a buffered oxide etch (BOE), respectively. In an alternate embodiment, the isotropic etch utilizes dry process. In one such embodiment, $NF_3$ is employed in a downstream plasma reactor to isotropically etch spacer films, such as, but not limited to, oxides and nitrides of silicon.

Figure 3F:
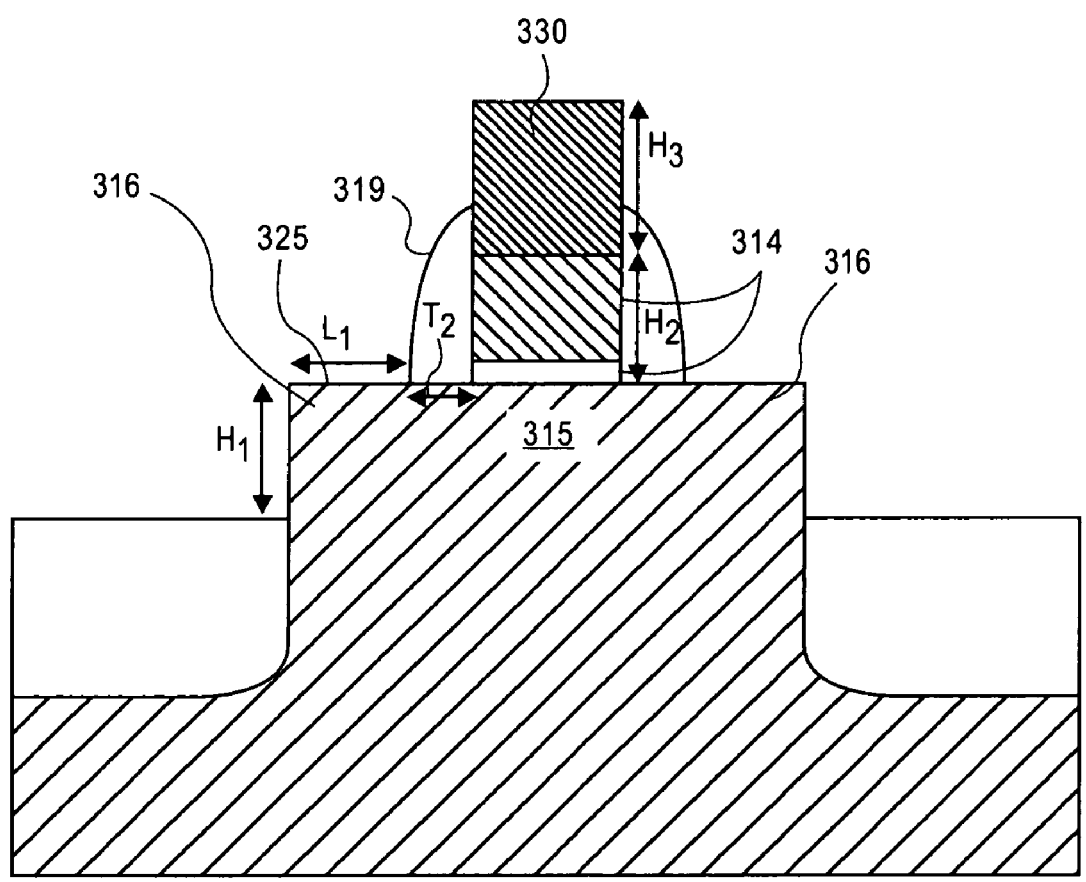
Figure 3G:
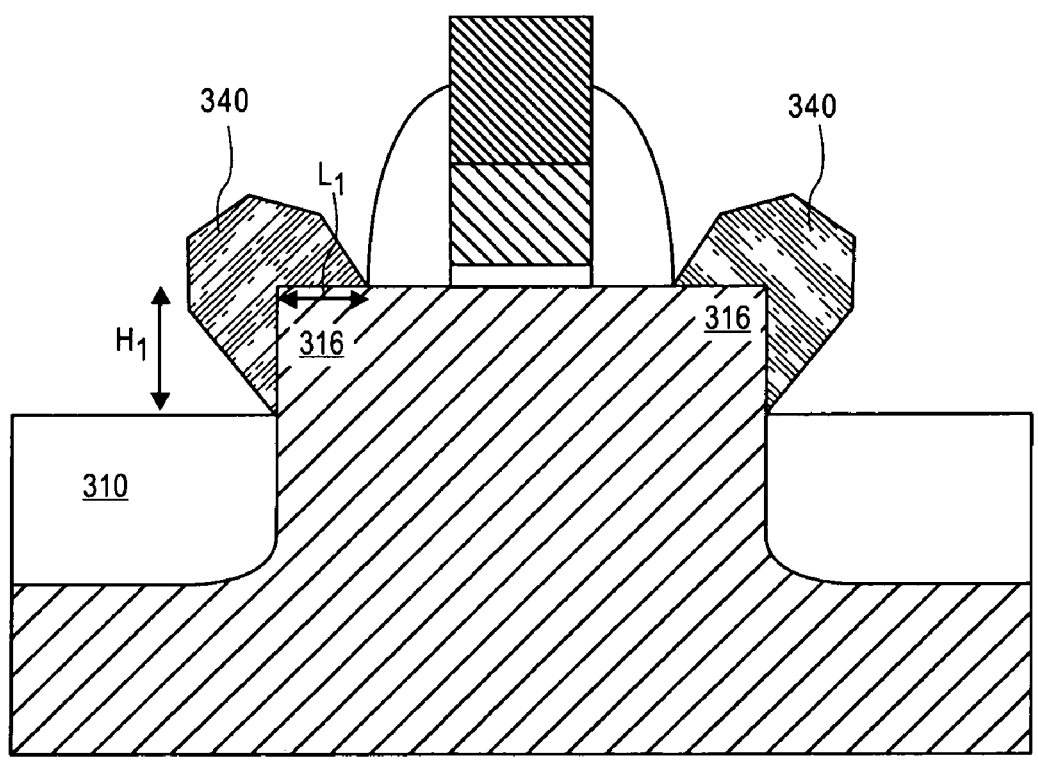

In the embodiment shown in FIG. 3F, the unpatterned isotropic etch removes undesired spacer 318 (of FIG. 3E) adjacent to the sidewall of the first non-planarity leaving only desired spacer 319 (equivalent to selective spacer 219 in the embodiment of FIG. 2) adjacent to the sidewall of the second non-planarity. In an embodiment, the unpatterned isotropic etch is performed to remove undesired spacer 318 from the full sidewall height $H_1$. Thus, for a given wet etch rate $R_w$, the isotropic etch is performed for a time $H_1/R_w$. Referring to FIG. 3F, because of the height differential between $H_1$ and the sum of $H_2+H_3$, the isotropic etch removes undesired spacer 318 exposing sidewall height $H_1$ of non-planar semiconductor body 315. Since the margin layer has a thickness at least as great as the sidewall height $H_1$, desired spacer 319 is eroded only enough to expose a portion of sidewall height $H_3$ while sidewall height $H_2$ of gate stack 314 remains completely protected. As shown in FIG. 3F, the final thickness $T_2$, or lateral width, of desired spacer 319 is less than the deposited thickness of spacer film 317 (FIG. 3D) because of the unpatterned isotropic etch. The excellent etch rate control of many commonly known isotropic etches provides sufficient control over the final thickness $T_2$.

In a further embodiment, the unpatterned isotropic etch also removes the thickness X of spacer film 317 (FIG. 3E) remaining after the first unpatterned etch. Thus, for a given wet etch rate $R_w$, the isotropic etch is performed for a time $(H_1+X)/R_w$. The isotropic chemical etch leaves surface 325 (FIG. 3F) substantially free of spacer etch damage along the length $L_1$. Thus, in a particular embodiment, non-planar source/drain regions 316 comprise self-aligned regions substantially free of sidewall spacers and etch damage. This provides a larger surface area and better quality surface for contacting source/drain regions 316 than would be possible with a non-selective spacer. In this embodiment, margin layer 330 having a thickness equal to the sidewall height $H_1$ added to thickness X (FIG. 3E) ensures that none of sidewall height $H_2$ is exposed during the etch of the undesired spacer having a height $H_1+X$.

Thus, because the isotropic spacer etch both thins the lateral width and reduces the vertical height of spacers, the height differential between $H_1$ and $H_3+H_2$ results in selective retention of desired spacer 319. Therefore, a properly selected margin layer 330 thickness in conjunction with subsequent anisotropic and isotropic etches enables a spacer to form, without any lithographically defined etches of the spacer film, on a first non-planar structure selective to a second non-planar structure.

Finally, with desired spacer 319 formed selectively, non-planar source/drain regions 316 may be self-alignedly doped and/or contacted by any means common in the art. Because non-planar source/drain regions 316 have a sidewall height $H_1$ substantially free of spacer along the length $L_1$, both the top surface and sidewalls of non-planar source/drain regions may be implanted, silicided, contacted, etc. In a particular embodiment shown in FIG. 3G, self-aligned epitaxial source/drain 340 is formed on non-planar source/drain regions. Along the length $L_1$, the top surface and sidewalls of non-planar source/drain regions 316 provide a growth surface for the epitaxial semiconductor layer. Because there is no spacer on sidewalls of non-planar source/drain regions 316, epitaxial source/drain 340 may be formed adjacent to isolation 310 for increased contact area. Self-aligned epitaxial source/drain 340 may be any commonly known epitaxial semiconductor that has good conductivity correct conductivity type for the particular device. In an embodiment, self-aligned epitaxial source/drain 340 comprise, silicon, germanium, and alloys thereof. Epitaxial growth is performed with commonly known techniques such as liquid phase epitaxy (LPE) or metal organic chemical vapor deposition (MOCVD) utilizing commonly available precursors.

In an alternate embodiment, a self-aligned silicide or "salicide" is performed on non-planar source/drain regions 316. Because the selective spacer process results in non-planar source/drain regions 316 with self-aligned regions substantially free of both sidewall spacers and etch damage, a larger surface area and better quality surface for salicidation is possible. Thus, with the selective spacer in place, further processing may be performed as common in the art.

Although the present invention has been described in language specific to structural features and/or methodological acts, it is to be understood that the invention defined in the appended claims is not necessarily limited to the specific features or acts described. For example, many applications may benefit from selective spacer processes in accordance with the present invention and one of ordinary skill in the art would recognize the multi-gate transistors described as particularly graceful implementations of the claimed invention useful for illustrating the present invention.

What is claimed is:

1. A method of forming a selective spacer on a device comprising:

forming a non-planar structure having a first sidewall and a second sidewall;

forming a margin layer having a sidewall over and in alignment with the second sidewall to augment the second sidewall for a total height greater than that of the first sidewall, wherein the margin layer is formed to have a thickness greater than the height of the first sidewall;

depositing a spacer film over the non-planar structure to cover the first sidewall and the second sidewall, wherein the spacer film is deposited to a thickness greater than the height of the first sidewall and less than the thickness of the second sidewall added to the thickness of the margin layer;

removing a portion of the spacer film with a first unpatterned etch to form a first spacer on the first sidewall and a second spacer on the second sidewall; and removing the first spacer from the first sidewall with a second unpatterned etch without removing the second spacer from the second sidewall to form the selective spacer.

2. The method of claim 1, wherein the spacer film is deposited conformally.

3. The method of claim 2, wherein the first unpatterned etch is anisotropic and the second unpatterned etch is isotropic.

4. The method of claim 1, wherein the first unpatterned etch is terminated before the full thickness of spacer film is etched to prevent damaging the top surface of the non-planar semiconductor, and wherein the second unpatterned removes the thickness of the spacer film remaining after the first unpatterned etch while removing the first spacer from the first sidewall.

5. A method of forming a multi-gate transistor comprising:

forming a non-planar semiconductor body having a top surface and a first sidewall;

forming a gate stack in contact with the non-planar semiconductor body, the gate stack having a top surface and a second sidewall;

forming on the gate stack a margin layer having a sidewall over and in alignment with the second sidewall to augment the second sidewall for a total height greater than that of the first sidewall;

depositing a spacer film over the non-planar semiconductor body and the gate stack to cover the first sidewall and the second sidewall, wherein the spacer film is deposited to a thickness greater than the height of the first sidewall;

removing a portion of the spacer film with an unpatterned anisotropic etch to form a first spacer adjacent to the first sidewall and form a second spacer adjacent to the second sidewall; and removing the first spacer from the first sidewall with an unpatterned isotropic etch without removing the second spacer from the second sidewall.

6. The method of claim 5, wherein the first unpatterned etch is terminated before the full thickness of spacer film is etched to prevent damaging the top surface of the non-planar semiconductor.

7. The method of claim 5, wherein depositing the spacer film on the non-planar structure covers the margin layer sidewall and removing the first spacer from first sidewall removes the spacer film from at least a portion of the margin layer sidewall.

8. The method of claim 5, wherein the margin layer is formed to have a thickness greater than the height of the first sidewall.

9. The method of claim 8, wherein the spacer film is deposited to a thickness less than the thickness of the gate stack added to the thickness of the margin layer.

* * * * *